US007802517B2

(12) United States Patent
Wessels et al.

(10) Patent No.: US 7,802,517 B2
(45) Date of Patent: Sep. 28, 2010

(54) METHOD OF PATTERNING MOLECULES ON A SUBSTRATE USING A MICRO-CONTACT PRINTING PROCESS

(75) Inventors: Jurina Wessels, Stuttgart (DE); Gregor Kron, Stuttgart (DE); Akio Yasuda, Esslingen (DE); Daniel Schwaab, Wesseling (DE); Dirk Mayer, Frechen (DE); Andreas Offenhaeusser, Eynatten (BE)

(73) Assignee: Sony Deutschland GmbH, Cologne (DE)

( * ) Notice: Subject to any disclaimer, the term of this patent is extended or adjusted under 35 U.S.C. 154(b) by 270 days.

(21) Appl. No.: 11/477,655

(22) Filed: Jun. 30, 2006

(65) Prior Publication Data

US 2007/0098899 A1 May 3, 2007

(30) Foreign Application Priority Data

Nov. 2, 2005 (EP) .................................. 05023880

(51) Int. Cl.
*B41M 3/00* (2006.01)

(52) U.S. Cl. ........................ 101/483; 977/789; 977/793; 977/887

(58) Field of Classification Search ........................ None
See application file for complete search history.

(56) References Cited

U.S. PATENT DOCUMENTS

| 5,948,621 | A | 9/1999 | Turner et al. |
| 6,180,239 | B1 | 1/2001 | Whitesides et al. |
| 6,399,295 | B1 | 6/2002 | Kaylor et al. |
| 2001/0055801 | A1* | 12/2001 | Chen et al. ................ 435/287.2 |
| 2003/0207467 | A1* | 11/2003 | Snyder et al. ............... 436/518 |
| 2004/0156988 | A1 | 8/2004 | Mehenti et al. |
| 2007/0178534 | A1* | 8/2007 | Murphy et al. ............... 435/7.2 |

FOREIGN PATENT DOCUMENTS

| WO | WO 2004/022338 A2 | 3/2004 |
| WO | WO 2005/058478 A1 | 6/2005 |

OTHER PUBLICATIONS

Hovis, J.S. and S.G. Boxer. Patterning barriers to lateral diffusion in supported lipid bilayer membranes by blotting and stamping. Langmuir 16:894-897; 2000.*
Tseng et al. Protein micro arrays immobilized by μ-stamps and -protein wells on PhastGel1 pad. Sensors and Actuators B 83:22-29 (2002).*
Tan et al. Microcontact printing of proteins on mixed self-assembled monolayers. Langmuir 18:519-523 (2002).*
GenBank GI:162648 [online] Feb. 11, 2002 [retrieved on Mar. 10, 2009] retrieved from http://www.ncbi.nlm.nih.gov/protein/162648.*

(Continued)

*Primary Examiner*—Samuel Woolwine
(74) *Attorney, Agent, or Firm*—Oblon, Spivak, McClelland, Maier & Neustadt, L.L.P.

(57) ABSTRACT

The present invention relates to a method of patterning molecules on a substrate using a micro-contact printing process, to a substrate produced by said method and to uses of said substrate. It also relates to a device for performing the method according to the present invention.

30 Claims, 4 Drawing Sheets

Scheme 1

Scheme 2

Scheme 3

Scheme 4

OTHER PUBLICATIONS

Libioulle et al. Contact-inking stamps for microcontact printing of alkanethiols on gold. Langmuir 15:300-4, 1999.*

Delamarche, E. "Microcontact Printing of Proteins" in Nanobiotechnology, 2004, Wiley-VCH Verlag GmbH & Co. KgaA, Weinheim, pp. 31-52.*

Oliva et al. Patterning axonal guidance molecules using a novel strategy for microcontact printing. Neurochemical Research 28(11):1639-1648, Nov. 2003.*

Zhou et al. Reversible hydrophobic barriers introduced by microcontact printing: application to protein microarrays. Microchim. Acta 146, 193-205 (2004).*

* cited by examiner

METHOD OF PATTERNING MOLECULES ON A SUBSTRATE USING A MICRO-CONTACT PRINTING PROCESS

FIELD

The present invention relates to a method of patterning molecules on a substrate using a micro-contact printing process, to a substrate produced by said method and to uses of said substrate. It also relates to a device for performing the method according to the present invention.

BACKGROUND

During the past decade, soft lithography has developed to a versatile technique for fabricating chemically micro- and nanostructured surfaces [1,2]. Among several techniques known collectively as soft lithography, micro-contact printing (μCP) has become the most commonly used method [1]. A patterned polymer stamp is covered with an ink of molecules using either contact inking or wet inking. In contact inking the solvent is reduced to the dry state while the molecules self assemble on an inkpad. The molecules are transferred onto the stamp under ambient conditions by bringing the stamp and the inkpad into conformal contact. In the wet inking process, the ink is poured over the stamp and then reduced under a stream of nitrogen to a dry state. In both cases the molecules are on the stamp prior to the transfer onto a substrate. For the transfer of the ink onto the substrate, stamp and substrate are brought into conformal contact with a substrate for the transfer of the molecules from the stamp to the substrate [3,4].

Recently, also proteins have been transferred to a variety of substrates [5-7]. The advantage of μCP thereby is the direct, fast and gentle transfer of proteins, however, all μCP-techniques reported so far ultimately lead to a denaturation of the printed proteins. Native proteins immobilized onto modified surfaces are of major interest for sensor technology, cell culturing and micro-biology. One application is e.g., the patterning of growth factor proteins on silicon oxide for guiding cell growth [8].

A critical issue for the immobilization of biomolecules, e.g. proteins, nucleic acids etc. on surfaces is their denaturation and hence the loss of the functionality after their immobilization. The functionality, as e.g. in the case of cytochrome c (cyt c), may depend on the orientation and conformation of the protein on the surface. So far, the immobilization and redox activity of cyt c has been investigated on chemically modified Au surfaces [9-11] and on ITO [12]. Runge et al. reported a process for the transfer for cyt C molecules onto ITO surfaces, in which the proteins are dried on the stamp [12]. For ITO-surfaces it could be demonstrated that the reactivity of the proteins depend on the surface modification of the stamps used for the process [11].

In addition to transferring proteins, a method for transfer-printing of highly aligned DNA nanowires has been described by Nakao et al. [13] using PDMS stamps. In this method hydrodynamic forces are used to align DNA on PDMS. After the alignment step the PDMS stamp is brought into conformal contact with a mica sheet for the transfer of DNA onto mica. AFM images showed that the apparent height of the as transferred DNA is between 0.27 and 0.35 nm, indicating that the DNA molecules are probably elongated and possibly sheared as a result of the hydrodynamic forces.

However, all the above described inking methods used in the prior art cause denaturation of the protein(s) and loss of their activity.

SUMMARY

Accordingly, it was an object of the present invention to provide for a method allowing the immobilization and patterning of molecules on a substrate, whereby the molecules to be patterned and immobilized retain their function and/or native conformation and/or activity. Furthermore, it was an object of the present invention to provide for a method of patterning molecules on a substrate that is easy to perform even with biological macromolecules whilst maintaining their functionality. Furthermore, it was an object of the present invention to provide for a method of patterning molecules on a substrate whereby pattern features $\leq 200$ nm can be achieved.

All these objects are solved by a method of patterning molecules on a substrate using a micro-contact printing process, whereby the molecules to be patterned are kept in solvent or are covered by solvent during the entire micro-contact printing process.

Such a micro-contact printing process in which the molecules to be patterned are kept in solvent or are covered by solvent during the entire process is herein also sometimes referred to as "in-situ printing process" or "in-situ stamping process". The term "in-situ printing process" or "in-situ stamping process" as used herein, is meant to denote a micro-contact printing process whereby the molecules to be patterned retain their functionality and/or conformation as a result of being kept in solvent or being covered by solvent during the entire printing process.

In a preferred embodiment such "in-situ printing process is meant to denote a micro-contact printing process in the entire course of which the molecules to be patterned are kept in their respective physiological conditions that allow them to retain their native functionality and/or conformation. It should be emphasized that the term "physiological conditions" will depend on the type of molecules to be patterned. For example, if the molecules to be patterned are molecules of an oxygen transporting protein, the "physiological conditions" for such a molecule will preferably include a pH-value in the range of from 7.0 to 7.8, preferably around pH 7.4. If, on the other hand, the molecules to be patterned are molecules of a gastric enzyme, the "physiological conditions" for such a molecule will include a pH-value in the range of from 1.8 to 4. Hence, overall the term "physiological conditions" will include pH-values that may range from 1 to 10.

In one embodiment said micro-contact printing process occurs in the absence of a drying step.

In one embodiment, the method according to the present invention comprises the following steps:

a) providing molecules to be patterned in a solvent and providing a patterned surface, preferably in the form of a stamp, b) transferring said molecules to be patterned onto said patterned surface and immobilizing them thereon whilst keeping said molecules in said solvent or covered by said solvent, c) providing a substrate and bringing said patterned surface having said molecules immobilized thereon into conformal contact with said substrate, thereby creating a pattern of said molecules on said substrate, whilst keeping said molecules in said solvent or covered by said solvent.

DETAILED DESCRIPTION

The term "to bring into conformal contact with" is meant to denote a contact between two entities, e.g. surfaces, allowing the transfer of molecules that were on one entity before the contact, to the other entity. In some embodiments, exertion of pressure is needed for such transfer to occur, and in these instances, the term "to bring into conformal contact with" is to be equated with "to press on(to)".

The term "to immobilize a molecule on a surface", as used herein, is meant to denote an activity by which a molecule becomes attached to a surface, It does not mean that a molecule thus immobilized will be unable to move completely. For example, parts of a molecule thus immobilized may still rotate about certain chemical bonds and/or may "swing" within the solvent covering the surface. "Immobilization", as used herein, merely implies some kind of attachment of a molecule to a surface which attachment prevents the molecule to diffuse freely from said surface. In its simplest form, such immobilization of molecules on a surface may occur by exposing said surface to said molecules.

In one embodiment in step a), said molecules are provided in said solvent and are first immobilized on an ink-pad, preferably in the form of a non-patterned surface, within said solvent, wherein, preferably, in step b), said ink-pad having said molecules immobilized thereon is brought into conformal contact with said patterned surface in a first solvent environment containing said molecules to be patterned, said solvent and, optionally, a buffer, thereby transferring said molecules onto said patterned surface and immobilizing them thereon, and wherein, more preferably, in step c), said substrate is provided in a second solvent environment containing said solvent and, optionally a buffer, and wherein said patterned surface having said molecules immobilized thereon, after step b), is transferred to said second solvent environment and is brought into conformal contact with said substrate. The first and second and subsequent solvent environments contain a solvent and may, in addition thereto, also contain a solute, such as a salt, preferably a buffer, more preferably a buffer by the presence of which physiological conditions are established or conditions are established which mimic a physiological state. The second and subsequent solvent environments initially contain no molecules to be patterned or only a very small amount thereof. As soon as the patterned surface or the ink-pad has been transferred to said second, third, fourth etc. solvent environment, however, there will be some molecules to be patterned present in said solvent environment.

The term "ink-pad", as used herein, is meant to signify any surface that is capable of acting as a transfer-facilitating surface for molecules to be patterned. In its simplest form it may simply be a non-patterned surface. Under certain conditions, however, it may also be some sort of surface that has a pattern on it, and/or that has the capacity of absorbing molecules to be patterned and the capacity of releasing some of these molecules upon bringing a stamp into conformal contact with said ink-pad.

In one embodiment in step b), said ink-pad having said molecules immobilized thereon is brought into conformal contact with said patterned surface in a second solvent environment containing said solvent and, optionally, a buffer, after transfer of said ink-pad having said molecules immobilized thereon to said second solvent environment, thereby transferring said molecules onto said patterned surface and immobilizing them thereon, wherein, preferably, in step c) said substrate is provided in a third solvent environment containing said solvent and, optionally, a buffer, and wherein said patterned surface having said molecules immobilized thereon, after step b), is transferred to said third solvent environment and is brought into conformal contact with said substrate.

In one embodiment in step a), said molecules are provided in said solvent and, in step b), said molecules are immobilized on said patterned surface within said solvent, wherein, preferably, step b) occurs by immersing said patterned surface in said solvent, and wherein, more preferably, in step c), said substrate is provided in a fourth solvent environment containing said solvent and, optionally, a buffer and wherein said patterned surface having said molecules immobilized thereon, after step b), is transferred to said fourth solvent environment and is brought into conformal contact with said substrate.

In one embodiment in step c), said substrate is provided without a solvent environment, and wherein said patterned surface having said molecules immobilized thereon is brought into conformal contact with said substrate whilst keeping said molecules covered by said solvent, and wherein said patterned surface is transferred to a fifth solvent environment containing said solvent and, optionally a buffer, whilst being in contact with said substrate, said transfer of said patterned surface and said substrate occurring immediately after said patterned surface is brought into conformal contact with said substrate, so as to avoid a drying of said patterned surface on said substrate.

In one embodiment, said step b) is performed over a period in the range of from 1 s to 60 min. Step b) may be considered an "inking step".

Preferably, the bringing into conformal contact of said patterned surface with said substrate of step c) occurs in a period not longer than 180 min after immobilizing said molecules to be patterned on said patterned surface, preferably not longer than 120 min, more preferably not longer than 10 min, most preferably not longer than 1 min after immobilizing said molecules to be patterned on said patterned surface.

As used in this context, the term "occurs in a period not longer than . . . after immobilizing . . ." is meant to denote that said bringing into conformal contact must take place within a period of 180 min at a maximum, said period commencing from the time that said molecules to be patterned are immobilized on said patterned surface.

In one embodiment after step c), said patterned surface is lifted from said substrate, thereby leaving behind a substrate having a pattern of said molecules thereon, wherein, preferably, said substrate having a pattern of molecules thereon is kept in or covered by solvent optionally containing a buffer.

In one embodiment said molecules to be patterned are selected from the group comprising proteins, nucleic acids, preferably DNA or RNA, lipids and combinations of any of the foregoing, wherein, preferably, said molecules to be patterned are protein molecules.

Preferably, said molecules to be patterned retain their function and/or activity and/or native conformation throughout the entire process, due to their being kept in solvent or covered by solvent during the entire micro-contact printing process, wherein, more preferably, said molecules to be patterned are kept under physiological conditions, as measured by, for example, pH and salinity, throughout the entire microcontact printing process.

The term "solutes" as used in this context, does not exclude the presence of solutes within the solvent. In fact, these may be preferred in order to establish the desired physiological conditions. Such solutes, without being limited thereto, include salts and their ion-components, buffers, proteins, nucleic acids and lipids.

In one embodiment said substrate has a hydrophilic surface if said molecules to be patterned are hydrophilic, and wherein said substrate has a hydrophobic surface if said molecules to be patterned are hydrophobic.

Preferably, said substrate comprises a spacer layer and/or a binding layer which facilitates binding of said substrate to said molecules to be patterned through covalent binding, electrostatic forces, van der Waals forces, H-bonding, London forces or any combination of the foregoing.

In one embodiment said substrate is selected from the group comprising metals and semi metals, single or polycrystalline materials; preferably single or polycrystalline metals and semi metals (most preferably gold, platinum, silicon) or; composite materials preferably single or polycrystalline composites (most preferably (siliconoxide, GaAs) or amorphous composite materials (most preferably glass); plastics, preferably elastomers (most preferably polydimethylsiloxane), preferably plastomers (most preferably polyolefines), preferably ionomers, preferably resist materials (most preferably UV-NIL resists); any of the afore mentioned materials modified with molecular layers, preferably SAMs (self assembling monolayers), for direct binding or indirect binding, SAMs for indirect binding will be with one or multiple chemicals or treatments to achieve the desired binding site; most preferably SAMs with two termini: one for attaching the molecule to the substrate such as a thiol-headgroup for binding on gold; most preferably SAMs with a silane-headgroup terminus for binding on siliconoxide; the second terminus for coupling the ink, such as SAMs with mercapto- or amino-groups for binding metals, SAMs with carboxy-groups for electrostatic binding, most preferably SAMs with mercapto-groups for binding metals, with plain alkylchains having methylene groups for van der Waals interaction, with —COOH, —OH or vinyl-groups for covalent coupling; or SAMs with antibodies for binding corresponding antigens, or SAMs with antigens for binding corresponding antibodies, or SAMs with receptors for specific binding of molecules; or any of the aforementioned materials modified with molecular layers, with antibodies for binding corresponding antigens, or modified with molecular layers with antigens for binding corresponding antibodies, or modified with molecular layers with receptors for specific binding of molecules; most preferably gold modified with a mercapto undecanoic acid layer (MUA).

Preferably, said patterned surface is made from a material selected from the group comprising single-crystalline materials and polycrystalline materials, such as silicon, silicon oxide, layered composite systems, such as silicon oxide on silicon, metal layers on silicon/silicon oxide; amorphous materials, such as glass; plastics, such as elastomers, preferably polydimethylsiloxane, plastomers, preferably polyolefines (POP, polyolefinic plastomers), ionomers, resist materials, such as UV-NIL-resists.

In one embodiment said ink-pad surface is made from a material selected from the group comprising single-crystalline materials and polycrystalline materials, such as silicon, silicon oxide, layered composite systems, such as silicon oxide on silicon, metal layers on silicon/silicon oxide; amorphous materials, such as glass; plastics, such as elastomers, preferably polydimethylsiloxane, plastomers, preferably polyolefines (POP, polyolefinic plastomers), ionomers, resist materials, such as UV-NIL-resists.

Preferably, said molecules to be patterned are selected from the group comprising protein molecules, such as redox proteins, nucleic-acid binding proteins, enzymes, metalloproteins, such as cytochrome c, azurin, cytoskeleton-proteins, antibodies, nucleic acids, such as DNA, RNA, PNA, lipids, such as phospholipids and sphingolipids.

In one embodiment said molecules to be patterned are protein molecules having one or several lysine residues, and wherein said substrate is Au, preferably having a spacer layer on its surface so as to avoid denaturation of said protein, said spacer layer preferably having a thickness in the range of from 0.5 nm to 200 nm.

In one embodiment the pattern comprises features having a length in the range of from approximately 10 nm to 500 µm, preferably approximately 10 nm to $\leq$200 nm, more preferably approximately 10 nm to $\leq$150 nm. It is clear that the size of the actual features printed by the method according to the present invention depends on the intended application of the pattern thus printed. For example, if the intended application lies in the field of nucleic acid chips or sensor applications, the average size of the printed features is likely to be in the range of from 1 µm to 500 µm. If the intended application lies in the field of molecular electronics, the average size of the printed features is likely to be in the range of from approximately 10 nm to $\leq$200 nm, preferably approximately 10 nm to $\leq$150 nm.

The objects of the present invention are also solved by a substrate produced by the method according to the present invention and comprising a pattern of molecules thereon which molecules retain their function and/or activity and/or native conformation.

The objects of the present invention are also solved by use of a substrate according to the present invention in a sensor, a bioreactor or for guiding cell growth.

The objects of the present invention are also solved by a device for performing the method according to the present invention, comprising
  a first means holding a solution of molecules to be patterned,
  a patterned surface, preferably in the form of a stamp,
  a substrate, kept in a solvent or covered by a solvent,
  a second means to transfer said molecules to be patterend from said first means to said patterned surface,
  a third means to transfer said molecules to be patterned from said patterned surface to said substrate,
  a fourth means to ensure that said molecules to be patterned are kept in a solvent or are covered by a solvent during transfer from said first means to said patterned surface to said substrate.

In a preferred embodiment of the device according to the present invention, the second means is an ink-pad, preferably a non-patterned surface.

The inventors have surprisingly found that it is possible to perform a micro-contact printing process using molecules, preferably biological macromolecules, such as proteins, nucleic acids and/or lipids, and keeping these biological macromolecules in solution or under solvent, preferably aqueous solvent all the time. The method according to the present invention can be performed using various schemes outlined further below.

As used herein, the term "molecules" is meant to denote any molecule which may have a biological relevance. It includes nucleic acids, including oligonucleotides, proteins, including peptides, and lipids. The molecules may be of synthetic or natural origin. In the case of proteins or nucleic acids, they may have sequences occurring in nature or they may have artificial sequences.

Hence the present inventors describe an in-situ stamping process that prevents drying or denaturation of the molecules, e.g. proteins on the stamp after the inking process. In this μCP process, the stamp, the inkpad (if present) and the substrate are kept during all process steps in a solvent environment, e.g. a buffer solution, or at least covered by a buffer solution. Thus all steps can be performed under in-situ physiological conditions.

Figure 4:
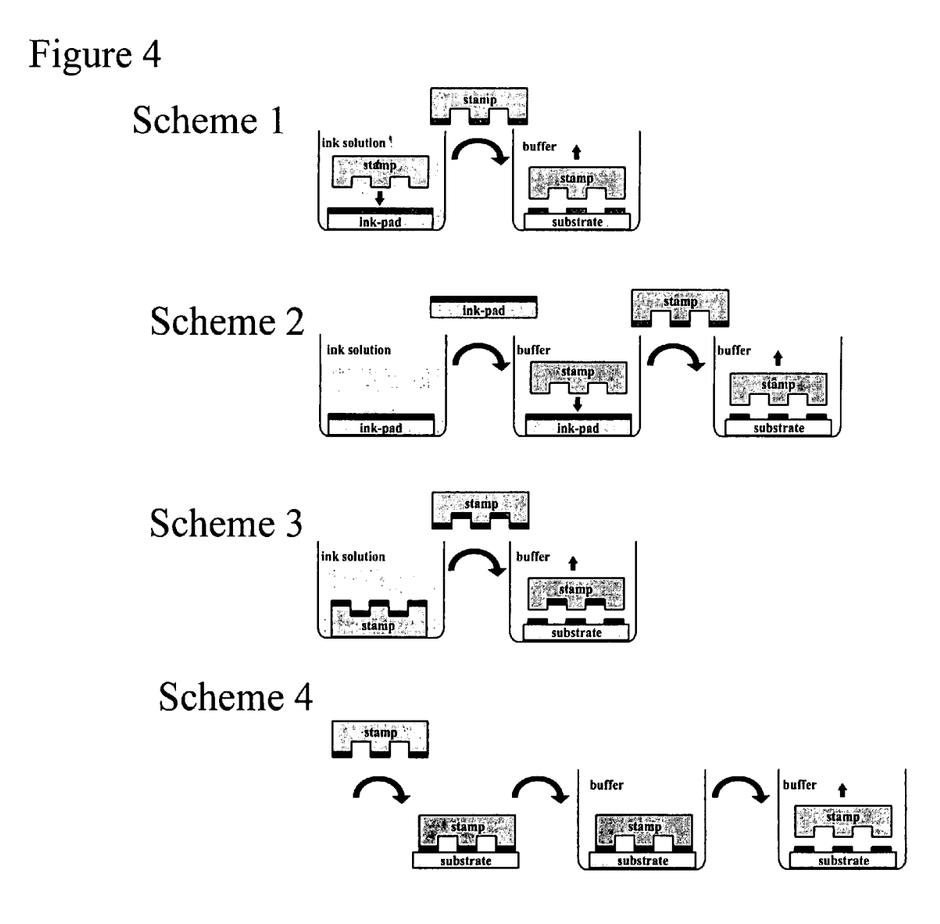
FIG. 4: shows a schematic representation of the various schemes 1-4 that are specific embodiments of the present invention.

In one aspect, the inventive method can be described by various processes which are explained further as follows:

Process 1 (see Scheme 1 of FIG. 4):

An ink-pad is immersed in the solution of the desired molecules. After several hours a stamp is immediately brought into contact with the ink-pad for a few minutes in the same container. The stamp is then rapidly transferred into a container with pure buffer solution, so that the stamp's surface does not dry. This buffer solution contains the substrate, on which the molecules should be transferred. The stamp is brought into contact with the substrate for a few minutes. Finally the modified substrate is inserted into a buffer solution, that is free of molecules to be printed/stamped, for storage.

Process 2 (see Scheme 2 of FIG. 4):

An ink-pad is immersed in the solution of the desired molecules. After several hours the ink-pad is rapidly transferred into a container with pure buffer solution, so that the ink-pad surface does not dry. A stamp is immediately brought into contact with the ink-pad for a few minutes. The stamp is than rapidly transferred into another container with pure buffer solution, which contains the target substrate. The stamp is pressed onto the substrate for a few minutes. Finally the modified substrate is inserted into a buffer solution for storage, that is free of molecules to be printed/stamped.

Process 3 (see Scheme 3):

A stamp is immersed in the solution of the desired molecules. The molecules adsorb to the stamp surface. After several hours the stamp is rapidly transferred into a container with pure buffer solution, so that the stamp's surface does not dry. This buffer solution contains the substrate, on which molecules should be transferred. The stamp is brought into contact with the substrate for a few minutes. Finally the modified substrate is inserted into a protein free buffer solution for storage, that is free of molecules to be printed/stamped.

Process 4 (see Scheme 4):

The stamp of schemes 1, 2 or 3, onto which molecules to be stamped have been immobilized is brought into contact with a substrate under ambient conditions directly after removing it from the ink-solution. This has to be done, as long the stamp is wet. The stamp with the attached substrate is put immediately into a container with pure buffer solution. After a few minutes the transfer is finished. Finally the modified substrate is inserted into a buffer solution for storage, that is free of molecules to be printed/stamped.

Figure 1:
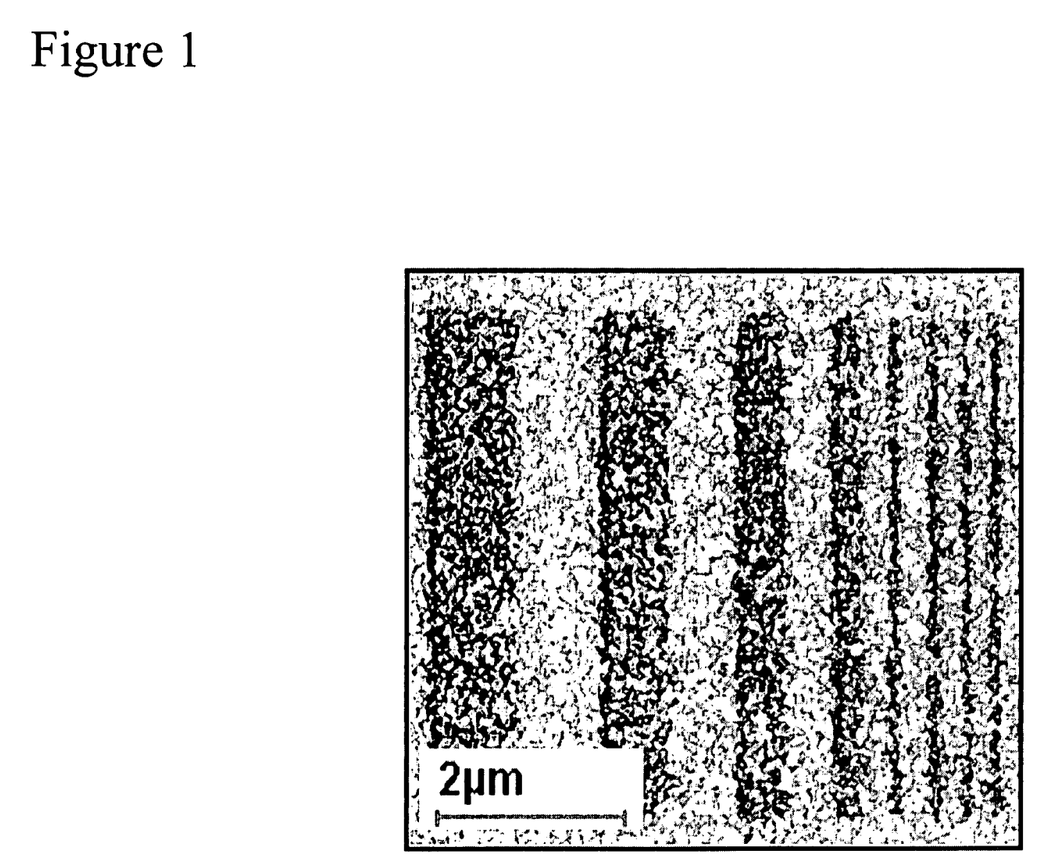
FIG. 1: SEM image of cyt c on (MUA)/gold The lines are 1 μm to 150 nm with equal gaps in between. The dark lines are cyt c molecules.

In the following reference is made to the figures wherein the figures show the following:

FIG. 1: SEM image of cyt c on (MUA)/gold. The lines are 1 μm to 150 nm with equal gaps in between. The dark lines are cyt c molecules.

Figure 2:
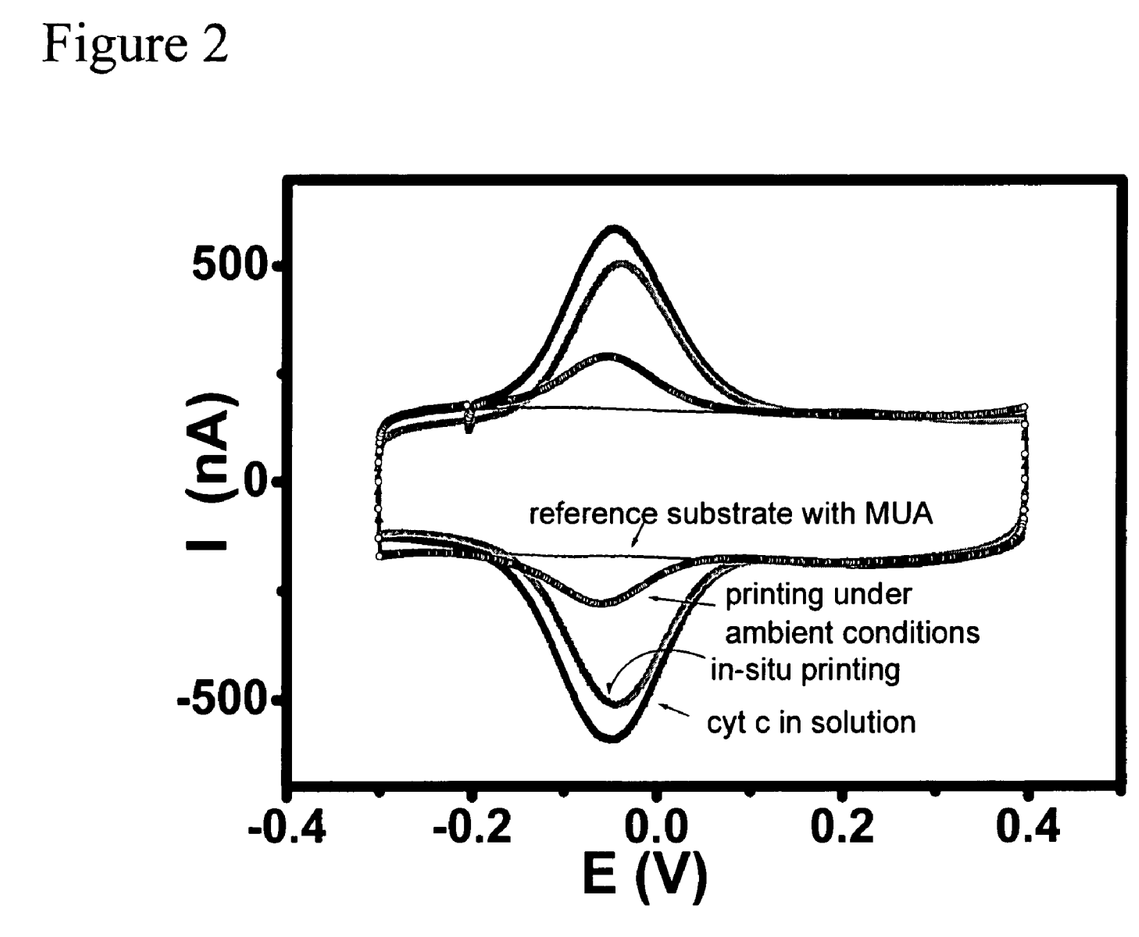
FIG. 2: Cyclic Voltammograms (scan rate: 50 m V/s; reference electrode: SCE) of cyt c on MUA/gold. Reference substrate without cyt c (–) cyt c absorbed from solution (▲), cyt c after in-situ stamping or printing (■), and cyt c after ambient stamping or printing (•)

FIG. 2: Cyclic Voltammograms (scan rate: 50 mV/s; reference electrode: SCE) of cyt c on MUA/gold. Reference substrate without cyt c (–), cyt c absorbed from solution (▲), cyt c after in-situ stamping or printing (■), and cyt c after ambient stamping or printing (•).

Figure 3:
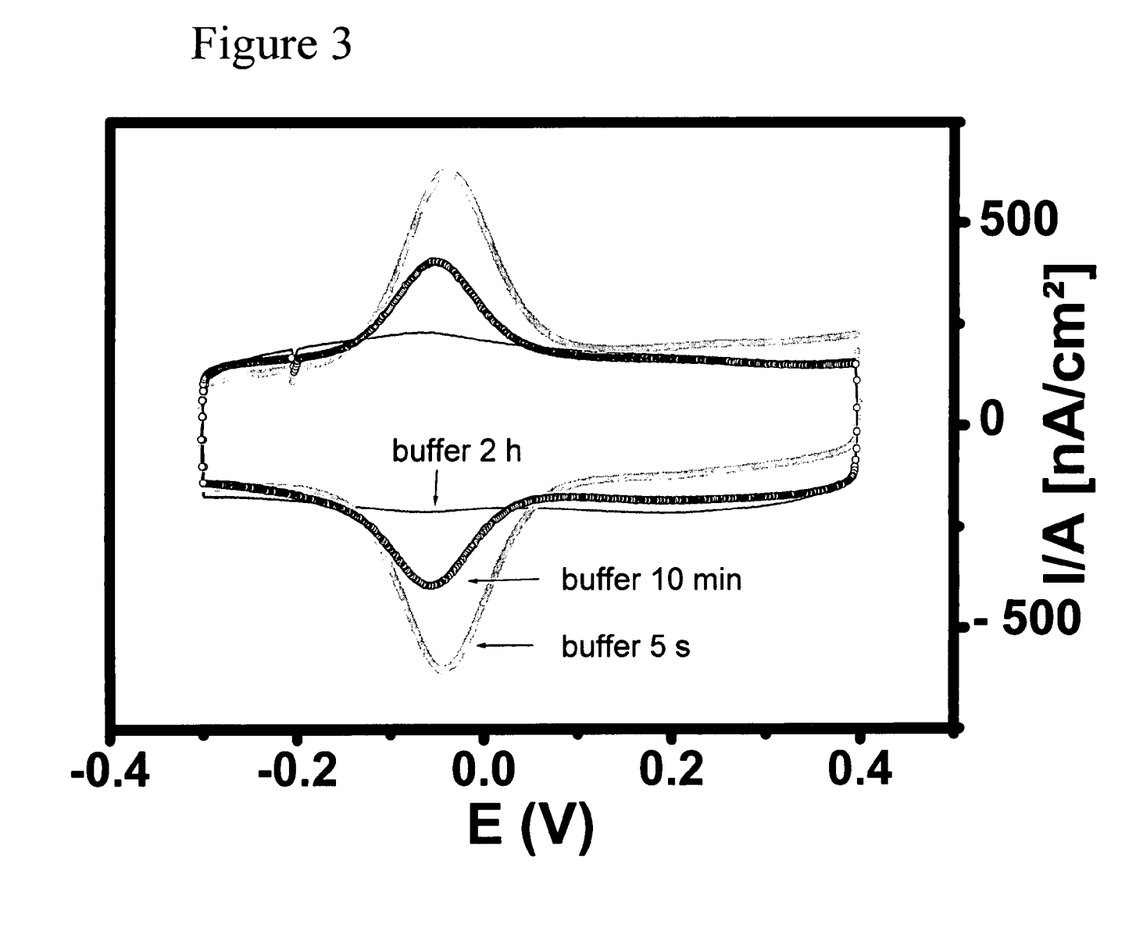
FIG. 3: Cyclic Voltammograms (scan rate: 50 m V/s; reference electrode: SCE) of cyt c on MUA/gold. Comparison of different times for which the stamp remains in a buffer reservoir before contacting the substrate, namely 5 s (■), 10 min (▲) and 2 h (–).

FIG. 3: Cyclic Voltammograms (scan rate: 50 mV/s; reference electrode: SCE) of cyt c on MUA/gold. Comparison of different times for which the stamp remains in a buffer reservoir before contacting the substrate, namely 5 s (■), 10 min (▲) and 2 h (–).

FIG. 4: shows a schematic representation of the various schemes 1-4 that are specific embodiments of the present invention.

More specifically, FIG. 4 and the schemes shown therein can be summarized as follows:

Scheme 1:

Schematic presentation of the in-situ micro-contact printing process. An inkpad is put into a buffered solution of Cytochrome c for 2 h. The stamp is placed on the inkpad for 2 min. The stamp is removed and rapidly brought into a buffer solution without drying. Immersed into the buffer solution is a gold substrate covered with a mercaptoundecanoic acid SAM. The stamp is brought into conformal contact with the substrate for 2 min and is released.

Scheme 2:

Schematic presentation of the in-situ micro-contact printing process. An inkpad is immersed into the solution containing the desired molecules. After several hours the ink-pad is rapidly transferred into a container with buffer solution. A stamp is immediately brought into contact with the ink-pad for a few minutes. Subsequently the stamp is transferred into a container with buffer solution, which contains also the target substrate. The stamp is pressed onto the substrate for a few minutes and is subsequently released.

Scheme 3:

Schematic presentation of the in-situ micro-contact printing process. A stamp is immersed in the solution of the desired molecules. The molecules adsorb to the stamp surface. After several hours the stamp is rapidly transferred into a container with pure buffer solution containing the target substrate. The stamp is brought into conformal contact with the substrate for a few minutes and is subsequently released.

Scheme 4:

The wet stamp prepared according to Scheme 1, 2 or 3 is brought into contact with a substrate under ambient conditions directly after removing it from the ink-solution. The stamp with the attached substrate is immediately immersed into a container with pure buffer solution. After a few minutes the stamp is released from the substrate.

Furthermore, reference is made to the following examples which are given to illustrate, not to limit the invention.

Example

A) Stamps and Functional/Structural Investigations

It is clear to someone skilled in the art that the choice of substrate and stamp depends on the molecules to be patterned. For example it is clear to someone skilled in the art that for printing nucleic acids, hydrophilic and hydrophobic substrates are suitable. Depending on the substrate hydrophilicity the DNA may be immobilized in from of bundles (hydrophobic surface) or as individual strands (hydrophilic substrate). It is also clear to someone skilled in the art that for the transfer of proteins containing cystein groups onto gold a spacerlayer (e.g Mercapto-SAM) has to be used to cover the bare gold surface in order to prevent the binding of cystein to gold which may denature the protein. On the other hand it is clear to someone skilled in the art that a hydrophilic polypeptide (with undefined tertiary and quaternary structure) like polylysin can be printed to a hydrophilic siliconoxide surface. It is also clear to someone skilled in the art that the choice of the stamp material depends on the pattern size. The minimum pattern size is strongly dependent on the tensile modulus of the materials, e.g PDMS with a tensile modulus of 1 MPa is good for printing patterns down to 300 nm, while for patterns below 300 nm Polyolefine with a tensile modulus of 1 GPa may be suitable. It is also clear to someone skilled in the art that for printing patterns on large areas a flexible stamp made out of a flexible plastic material is more preferable than made of any other material, because the flexible stamp is able to make a conformal contact on the whole area. It is also clear to someone skilled in the art that the hydrophilicity of the stamp and the substrate and the solubility of the biomolecules to be transferred determine the interaction of the bio-molecules with the inkpad, the stamp and the substrate.

The stamps for the process can generally be made from elastomers, plastomers, ionomers, resist materials, and also from hard materials such as crystalline and polycrystalline materials. It is also possible to use a combination of these materials for the preparation of composite stamps (soft-soft, soft-hard, and hard-hard). The stamps are prepared either by drop casting and thermal- or photo-induced curing or by hot embossing techniques from masters that are, if required, passivated with a release layer, e.g. a monolayer of (1,1,2,2,-tridecafluoro-octyl)-trichlorosilane, or sodium dodecyl sulfate (SDS). The surface of the stamp surface can be chemically modified by exposing the stamp surface to e.g. an oxygen plasma or by chemically reacting it.

For the specifically disclosed embodiments further below, POP (polyolefine plastomer) (Affinity VP 8770G) from Dow Chemicals was used. POP was heated up to 85° C. and pressed with 90 kPa into a silicon oxide (Sioxide) master, which is passivated with monolayer of (1,1,2,2,-tridecafluoro-octyl)-trichlorosilane (Sigma Aldrich).

All specific embodiments were performed using horse heart cytochrome c as a model system.

The redox activity of the proteins was investigated using a PAR Model 283 potentiostat controlled by a PC running version 2.4 of CorrWare software. The working electrode was an Au(111) single crystal cylinder with a diameter of 3.5 mm. For the measurement the hanging meniscus method was applied. In this method the particular metal plane of the single crystal is brought into contact with the electrolyte by forming a meniscus. The Au crystal was deaned in sulfuric acid. After flame annealing the Au(111) crystals was placed for 10 min into mercaptoundecanoic acid (MUA) (Sigma-Aldrich) and subsequently rinsed with ethanol and MilliQ water (18.2 MΩ, total amount of carbon 3-4 ppm). A standard calomel electrode (SCE) was used as reference electrode; the counter electrode is a platinum coil. The setup was placed in a Faraday cage to reduce electronic noise.

For SEM imaging, a 5 nm chromium and 50 nm gold layer was evaporated onto a piece of silicon oxide wafer. The chip was also cleaned with sulfuric acid, flame annealed and placed into a 10 mM ethanolic solution of MUA (Sigma-Aldrich) for 10 min.

B) Preparation and Printing

A sodium phosphate solution ($Na_2HPO_4/NaH_2PO_4$) (Merck) at pH 7 with a concentration of 3.26 mM was used as a buffer to prepare a 12.6 µM hourse heart cyt c (Sigma-Aldrich) solution. A Polydimethylsiloxane (PDMS) (Sylgard 184, Dow Coming) inkpad was immersed into the cyt c solution. After 2 h, the stamp was introduced into the solution and gently pressed onto the inkpad for 2 min. Immediately after the separation of the inkpad and the stamp, the stamp was introduced into the buffer solution containing the substrate without drying, in order to cover the proteins with a thin wet film maintaining the desired physiological conditions during the transfer of the stamp from one solution to the other. The transfer time was less than 5 s. After transferring the stamp into the solution containing the substrate, the stamp was brought into conformal contact with the substrate for 2 min by applying gentle finger pressure, for the transfer of the proteins from the stamp onto the MUA modified Au substrate. The immobilization of cyt c onto a MUA SAM is based on electrostatic interaction.

The acid group of MUA is deprotonated and thus negatively charged, while cyt c has a positive net charge. Since the positive charge of the lysine groups are located on one side of the cyt c, the orientation of cyt c on the surface is always the same. FIG. 1 shows a SEM image of the transferred pattern. The four 150 nm broad lines are dearly separated by a 150 nm wide gap (right side). The interspacing between transferred lines is free of molecules. No common drawbacks or shortcoming of µCP like sagging or diffusion of the ink molecules can be seen.

C) Cyclic Voltammetry Measurements

The redox activity of proteins stamped with an unstructured stamp onto a Au/Cr coated Si/Sioxide wafer was measured with cyclic voltammetry. The proteins were stamped in the same way as described under B). After transferring the proteins onto the substrate, the substrate was directly transferred into the measurement cell. FIG. 2 shows cyclic voltammograms of cyt c after the in-situ µCP process ("in-situ printing") according to the present invention in comparison with cyt c stamped under ambient conditions, i.e. where cyt c was dried on the stamp ("printing under ambient conditions) and a voltammogramm of cyt c adsorbed from solution ("cyt c in solution"). In all cases a distinct and reversible redox peak occurred at a redox potential of $E^0=-60$ mV. The symmetry of the peak indicates that cyt c is adsorbed onto a surface. The current at the redox potential is comparable for the samples prepared by in-situ printing and by adsorption from solution, while the current observed for the proteins transferred under ambient conditions is 70% smaller. This could be either due to a lower protein density or result from a partial loss in functionality due to the drying process.

One, important aspect for the process appears to be the time duration the stamp is exposed to the buffer solution without being in conformal contact with the substrate. FIG. 3 shows redox activity of transferred proteins after the stamp was exposed to buffer solution for 5 s to 120 min(5 s, 10 min and 2 h) prior to the transfer process. The longer the stamp was exposed to the buffer solution, the lower was the current at the redox potential. The reduction in the current is due to a decrease in the surface coverage on the stamp. Since the proteins are only weakly adsorbed by London forces to the stamp surface, the concentration gradient drives desorption of the proteins into the buffer solution.

The process according to the present invention allows to pattern biomolecules to dimensions down to 150 nm, while preserving their structural integrity and functionality by using an in-situ process.

The features of the present invention disclosed in the specification, the claims and/or in the accompanying drawings, may, both separately, and in any combination thereof, be material for realizing the invention in various forms thereof.

REFERENCES

1. Xia, Y; Whitesides, G. M.; Annu. Rev. Mater. Sci. 28 (1998), 153-184.
2. Michel, B. et al.; IBM J. Res. & Dev. 45 (2001), 697-719.
3. Delamarche, E. et al.; J. Phys. Chem. B 102 (1998), 3324-3334.
4. Delamarche, E. et al.; J. Am. Chem. Soc. 124 (2002), 3834-3835.
5. Bernard, A.; Delamarche, E.; Schmid, H.; Michel, B.; Bosshard, H. R.; Biebuyck, H. Langmuir 1998, 14, 2225-2229.
6. James, C. D.; Davis, R. C.; Kam, L.; Craighead, H. G.; Isaacson, M.; Turner, J. N.; Shain, W. Langmuir 1998, 14, 741-744.
7. Bernard, A.; Renault, J. P.; Michel, B.; Bosshard, H. R.; Delamarche, E. Adv. Mater. 2000, 12, 1067-1070.
8. Lauer L.; Ingebrandt J. P.; Scholl M.; Offenhauser A. IEEE Trans Biomed Eng 2001, 48, 83842.
9. Tarlov, M. J.; Bowden, E. F. J. Am. Chem. Soc. 1991, 113, 1847-1849.
10. Song, S.; Clark, R. A.; Bowden, E. F, J, 7. Phys. Chem. 1993, 97, 6564-6572.
11. Clark, R. A.; Bowden, E. F. Langmuir 1997, 13, 559-565.
12. Runge, A. F.; Saavedra S. S. Langmuir 2003, 19, 9418-9424
13. Nakao, H.; Gad, M.; Sugiyama, S.; Otobe, K.; Ohtani; T. J. Am. Chem. Soc. 2003, 125, 7162.

The invention claimed is:

1. A method of patterning molecules on a substrate using a micro-contact printing process, whereby the molecules to be patterned are kept in solvent or are covered by solvent during the entire micro-contact printing process, said method comprising:
providing molecules to be patterned in a solvent and providing a patterned surface, said molecules being first immobilized on an ink-pad within said solvent;
transferring said molecules to be patterned onto said patterned surface and immobilizing them thereon while keeping said molecules in said solvent or covered by said solvent, said ink-pad having said molecules immobilized thereon is brought into conformal contact with said patterned surface in a first solvent environment containing said molecules to be patterned and said solvent, thereby transferring said molecules onto said patterned surface and immobilizing them thereon; and
providing a substrate in a second solvent environment, transferring said patterned surface having said molecules immobilized thereon to said second solvent environment, and bringing said patterned surface having said molecules immobilized thereon into conformal contact with said substrate, thereby creating a pattern of said molecules on said substrate, while keeping said molecules in said solvent or covered by said solvent, wherein said molecules to be patterned are protein molecules,
wherein said micro-contact printing process occurs in the absence of a drying step.

2. The method according to claim 1, wherein the bringing into conformal contact of said patterned surface with said substrate of the providing a substrate occurs in a period not longer than 180 min after immobilizing said molecules to be patterned on said patterned surface.

3. The method according to claim 1, wherein, after the providing a substrate, said patterned surface is lifted from said substrate, thereby leaving behind a substrate having a pattern of said molecules thereon.

4. The method according to claim 3, wherein said substrate having a pattern of molecules thereon is kept in or covered by solvent containing a buffer.

5. The method according to claim 1, wherein said molecules to be patterned retain their function and/or activity and/or native conformation throughout the entire process, due to their being kept in solvent or covered by solvent during the entire micro-contact printing process.

6. The method according to claim 1, wherein said substrate comprises a spacer layer and/or a binding layer which facilitates binding of said substrate to said molecules to be patterned through covalent binding, electrostatic forces, van der Waals forces, H-bonding, London forces or any combination of the foregoing.

7. The method according to claim 1, wherein said substrate is selected from the group consisting of: metals and semi metals, single or polycrystalline materials; single or polycrystalline metals and semi metals, gold, platinum, or silicon, or; composite materials of single or polycrystalline composites, siliconoxide, or GaAs, or amorphous composite materials or glass; plastics, or elastomers or polydimethylsiloxane, or plastomers, or polyolefines, or ionomers, or resist materials, or UV-NIL resists.

8. The method according to claim 1, wherein said patterned surface is made from a material selected from the group consisting of: single-crystalline materials and polycrystalline materials, silicon, silicon oxide, layered composite systems, silicon oxide on silicon, metal layers on silicon or metal layers on silicon oxide; amorphous materials, glass; plastics, elastomers, polydimethylsiloxane, plastomers, polyolefines (POP, polyolefinic plastomers), ionomers, resist materials, or UV-NIL-resists.

9. The method according to claim 1, wherein at least a surface of said ink-padis made from a material selected from the group consisting of single-crystalline materials and polycrystalline materials, silicon, silicon oxide, layered composite systems, silicon oxide on silicon, metal layers on silicon/ siliconoxide; amorphous materials, glass; plastics, elastomers, polydimethylsiloxane, plastomers, polyolefines (POP, polyolefinic plastomers), ionomers, resist materials, or UV-NIL-resists.

10. The method according to claim 1, wherein said molecules to be patterned are selected from the group consisting of: redox proteins, nucleic-acid binding proteins, metalloproteins, cytochrome c, azurin, cytoskeleton-proteins.

11. The method according to claim 1, wherein said protein molecules to be patterned have one or plural lysine residues, and wherein said substrate is Au, or Au having a spacer layer on its surface so as to avoid denaturation of said protein, said spacer layer having a thickness in the range of from 0.5 nm to 200 nm.

12. The method according to claim 1, wherein the pattern comprises features having a length in the range of from approximately 10 nm to 500 µm.

13. The method according to claim 1, wherein said providing a patterned surface includes providing a patterned surface in the form of a stamp.

14. The method according to claim 1, wherein said providing molecules to be patterned in a solvent includes providing molecules first immobilized on an ink-pad in the form of a non-patterned surface within said solvent.

15. The method according to claim 1, wherein said first solvent environment also includes a buffer.

16. The method according to claim 1, wherein said second solvent environment also includes a buffer.

17. The method according to claim 1, wherein the bringing into conformal contact of said patterned surface with said substrate of the providing a substrate occurs in a period not longer than 120 min after immobilizing said molecules to be patterned on said patterned surface.

18. The method according to claim 1, wherein the bringing into conformal contact of said patterned surface with said substrate of the providing a substrate occurs in a period not longer than 10 min after immobilizing said molecules to be patterned on said patterned surface.

19. The method according to claim 1, wherein the bringing into conformal contact of said patterned surface with said substrate of the providing a substrate occurs in a period not longer than 1 min after immobilizing said molecules to be patterned on said patterned surface.

20. The method according to claim 1, wherein the pattern comprises features having a length in the range of from approximately 10 nm to $\geq$200 nm.

21. The method according to claim 1, wherein the pattern comprises features having a length in the range of from approximately 10 nm to $\geq$150 nm.

22. The method according to claim 1, wherein the substrate is modified with a molecular layer.

23. The method of claim 22, wherein the molecular layer is a self assembling monolayer (SAM).

24. The method of claim 23, wherein the molecules of the SAM have two termini, a first terminus for binding to the substrate, and a second terminus for binding the protein molecules to be patterned.

25. The method of claim 24, wherein the substrate comprises gold and the first terminus comprises a thiol for binding to the gold.

26. The method of claim 24, wherein the substrate comprises silicon oxide and the first terminus comprises a silane for binding to the silicon oxide.

27. The method according to claim 24, wherein the SAM is selected from the group consisting of: a SAM with mercapto- or amino-groups for binding metals, a SAM with carboxy-groups for electrostatic binding, a SAM with mercapto-groups for binding metals, with plain alkyl chains having methylene groups for van der Waals interaction, with —COOH, —OH or vinyl-groups for covalent coupling, or SAMs with antibodies for binding corresponding antigens, or SAMs with antigens for binding corresponding antibodies, or SAMs with receptors for specific binding of molecules.

28. The method according to claim 22, wherein the molecular layer includes antibodies for binding antigens or includes antigens for binding corresponding antibodies.

29. The method according to claim 22, wherein the molecular layer includes receptors for specific binding of molecules.

30. The method according to claim 1, wherein the substrate is gold modified with a mercapto undecanoic acid layer (MUA).

* * * * *